(12) United States Patent
Lee et al.

(10) Patent No.: US 9,041,043 B2
(45) Date of Patent: May 26, 2015

(54) LIGHT EMITTING DEVICE PACKAGE

(75) Inventors: HaeKyung Lee, Seoul (KR); ChoongYoul Kim, Seoul (KR); HyunGoo Kang, Seoul (KR); KiHo Hong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 272 days.

(21) Appl. No.: 13/106,066

(22) Filed: May 12, 2011

(65) Prior Publication Data
US 2011/0222278 A1    Sep. 15, 2011

(30) Foreign Application Priority Data
May 12, 2010  (KR) .................. 10-2010-0044608

(51) Int. Cl.
| | |
|---|---|
| H01L 33/00 | (2010.01) |
| H01L 25/075 | (2006.01) |
| H01L 33/48 | (2010.01) |
| H01L 33/56 | (2010.01) |
| H01L 33/60 | (2010.01) |

(52) U.S. Cl.
CPC .......... *H01L 25/0753* (2013.01); *H01L 33/486* (2013.01); *H01L 33/56* (2013.01); *H01L 33/60* (2013.01); *H01L 2933/0091* (2013.01); *H01L 2224/48091* (2013.01)

(58) Field of Classification Search
USPC .................. 438/121; 362/235; 257/21, 99
See application file for complete search history.

(56) References Cited

U.S. PATENT DOCUMENTS

| | | | |
|---|---|---|---|
| 6,936,855 B1 * | 8/2005 | Harrah ............................ 257/88 |
| 7,371,593 B2 * | 5/2008 | Harada ........................... 438/26 |
| 7,649,920 B2 * | 1/2010 | Welford ......................... 372/34 |
| 8,183,583 B2 * | 5/2012 | Jung et al. ...................... 257/89 |
| 8,450,764 B2 * | 5/2013 | Suzuki et al. ................... 257/99 |
| 2007/0096113 A1 * | 5/2007 | Inoshita et al. ................. 257/79 |
| 2007/0267637 A1 * | 11/2007 | Kim et al. ....................... 257/81 |
| 2008/0064131 A1 * | 3/2008 | Chang ............................. 438/29 |
| 2008/0237621 A1 * | 10/2008 | Takemoto ....................... 257/98 |
| 2008/0316741 A1 * | 12/2008 | Lee ............................... 362/231 |

* cited by examiner

*Primary Examiner* — Brett Feeney
*Assistant Examiner* — Damian A Hillman
(74) *Attorney, Agent, or Firm* — KED & Associates LLP

(57) ABSTRACT

A light emitting device package is provided that comprises first and second light emitting devices including light emitting diodes, a body a body having a first cavity in which the first light emitting device is positioned and a second cavity in which the second light emitting device is positioned and a resin material formed in the cavity, wherein the resin material includes, a first resin material formed in the first cavity, a second resin material formed in the second cavity, and a third resin material formed an upper surface of the first and second resin materials, wherein at least one of the first resin material and the second resin material includes a light diffusing material.

17 Claims, 9 Drawing Sheets

US 9,041,043 B2

LIGHT EMITTING DEVICE PACKAGE

CROSS-REFERENCE TO RELATED APPLICATION

This application claims the priority benefit of Korean Patent Application No. 10-2010-0044608, filed on May 12, 2010 in the Korean Intellectual Property Office, the disclosure of which is incorporated herein by reference.

BACKGROUND OF THE INVENTION

1. Technical Field

Embodiments are directed to a light emitting device package.

2. Discussion of the Related Art

Light emitting devices are semiconductor devices that convert electrical energy into light. Light emitting devices draw attention as alternatives to existing light sources, such as fluorescent lamps or incandescent lamps, by virtue of low power consumption, a long lifespan, a rapid response, and eco-friendly characteristics.

A need exists to replace the existing light sources by light emitting devices and to improve color rendition and light-diffusing characteristics of the light emitting devices.

SUMMARY

Embodiments provide a light emitting device package having a structure that may reduce loss of light emitted from a light emitting device and illuminating lighting system including the light emitting device package.

According to an embodiment, first and second light emitting devices, a body a body having a first cavity in which the first light emitting device is positioned and a second cavity in which the second light emitting device is positioned and a resin material formed in the cavity, wherein the resin material includes, a first resin material formed in the first cavity, a second resin material formed in the second cavity, and a third resin material formed an upper surface of the first and second resin materials, wherein at least one of the first resin material and the second resin material includes a light diffusing material.

According to the embodiments, light emitted from the light emitting devices may be diffused by the light diffusing materials formed on the light emitting devices and the phosphors may be excited by the diffused light to emit light, thus reducing loss of light and enhancing light extraction efficiency.

DETAILED DESCRIPTION OF THE EXEMPLARY EMBODIMENTS

Figure 1:
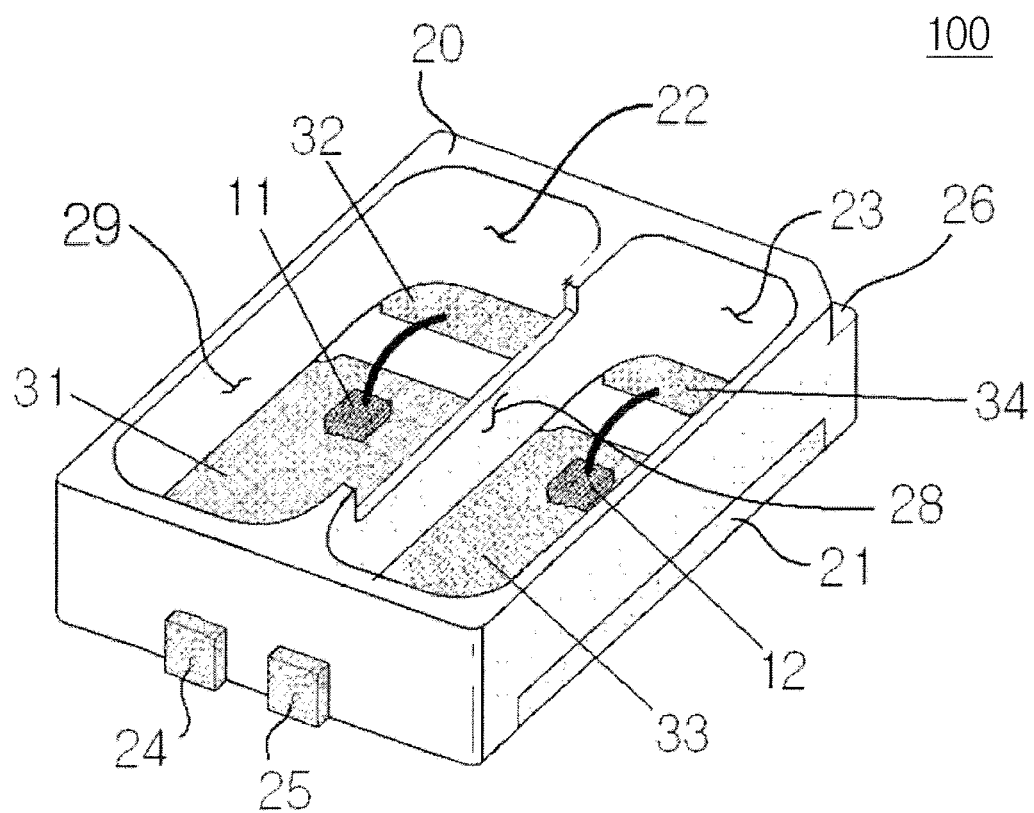
FIG. 1 is a perspective view illustrating a light emitting device package according to an embodiment.

Hereinafter, embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of light emitting device package structures, which are not clearly described herein, are based on those shown in the drawings.

FIG. 1 is a perspective view illustrating a light emitting devices package according to an embodiment.

Referring to FIG. 1, the light emitting device package 100 includes a body 20, first and second electrodes 31 and 32, and third and fourth electrodes 33 and 34. The body 20 includes a main barrier wall 29 and an auxiliary barrier wall 28 that form first and second cavities 22 and 23. The first and second electrodes 31 and 32 are formed in the first cavity 22, and the third and fourth electrodes 33 and 34 are formed in the second cavity 23.

Terminals 24 and 25 are provided on an outer surface of the body 20 to supply electricity from an external source (not shown) to first and second light emitting devices 11 and 12.

The body 20 may be formed of at least one of a resin, such as polyphthalamide (PPA), silicon (Si), aluminum (Al), aluminum nitride (AlN), $AlO_x$, photo sensitive glass (PSG), polyamide 9T (PA9T), syndiotactic polystyrene (SPS), metal, sapphire ($Al_2O_3$), beryllium oxide (BeO), or a printed circuit board (PCB). The body 20 may be formed by, but not limited to, injection molding or etching.

According to an embodiment, the body 20 may be formed of a conductive metal and an insulation film (not shown) may be formed on a surface of the body 20 so that the body 20 may be electrically insulated from the first to fourth electrodes 31, 32, 33, and 34.

An upper portion of the body 20 may have various shapes, such as a triangle, a rectangle, a polygon, or a circle, depending on use and design of the light emitting devices.

The first and second cavities 22 and 23 may have a cross section of a cup shape or a concave vessel, and an inner surface of the first and second cavities 22 and 23 may be perpendicular to a lower portion of the first and second cavities 22 and 23 or inclined with respect to a line perpendicular to the lower portion.

A front surface of the first and second cavities 22 and 23 may have a shape such as, but not limited to, a circle, a rectangle, a polygon, or an ellipse.

A rough portion 21 may be formed on at least one surface of the body 20 by a process of manufacturing light emitting devices, for example, a cutting process of separating a plurality of light emitting devices into individual element units.

A cathode mark 26 may be formed at an upper portion of the body 20. The cathode mark 26 is used to differentiate polarities of the first to fourth electrodes 31, 32, 33, and 34 from one another and to prevent confusion from occurring when electrically connecting the first to fourth electrodes 31, 32, 33, and 34.

The first and second electrodes 31 and 32 are electrically separated from each other, and the third and fourth electrodes 33 and 34 are electrically separated from each other.

The first to fourth electrodes 31, 32, 33, and 34 may be formed of a conductive material, for example, one or more or an alloy of titanium (Ti), copper (Cu), nickel (Ni), gold (Au), chrome (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), or iron (Fe). The first to fourth electrodes 31 to 34 may have, but not limited to, a single layer or a multilayer structure.

The first to fourth electrodes 31, 32, 33, and 34 are electrically connected to the first and second light emitting devices 11 and 12. The first to fourth electrodes 31, 32, 33, and 34 are connected to positive and negative electrodes of an external power supply (not shown) to supply electricity to the first and second light emitting devices 11 and 12.

According to embodiments of the present invention, the first and second light emitting devices 11 and 12 may include, but not limited to, colored light emitting devices that emit red, green, blue, or white light, or UV (Ultra Violet) light emitting devices that emit UV rays.

The first and second light emitting devices 11 and 12 may include light emitting diodes.

The first and second light emitting devices 11 and 12 may be electrically connected to the first to fourth electrodes 31, 32, 33, and 34 by wire bonding.

In the case of horizontal types, the first and second light emitting devices 11 and 12 may be electrically connected to the first to fourth electrodes 31, 32, 33, and 34 by metal lines.

In the case of vertical types, the first and second light emitting devices 11 and 12 may be die-bonded on the first and third electrodes 31 and 33 and wire-bonded to the second and fourth electrodes 32 and 34.

In the case of flip types, the first and second light emitting devices 11 and 12 may be electrically connected to the first to fourth electrodes 31, 32, 33, and 34 by a die bonding method, etc.

Although not shown in the figures, a resin material (not shown) may be filled in the first and second cavities 22 and 23 to cover the first and second light emitting devices 11 and 12.

The body 20 may be formed in a slug type to easily dissipate heat generated from the first and second light emitting devices 11 and 12.

First and second heat conductive members (not shown) are formed under the first and second light emitting devices 11 and 12. The first and second heat conductive members may have a width equal to or larger than that of the first and second light emitting devices 11 and 12, which will be described below in detail.

Figure 2:
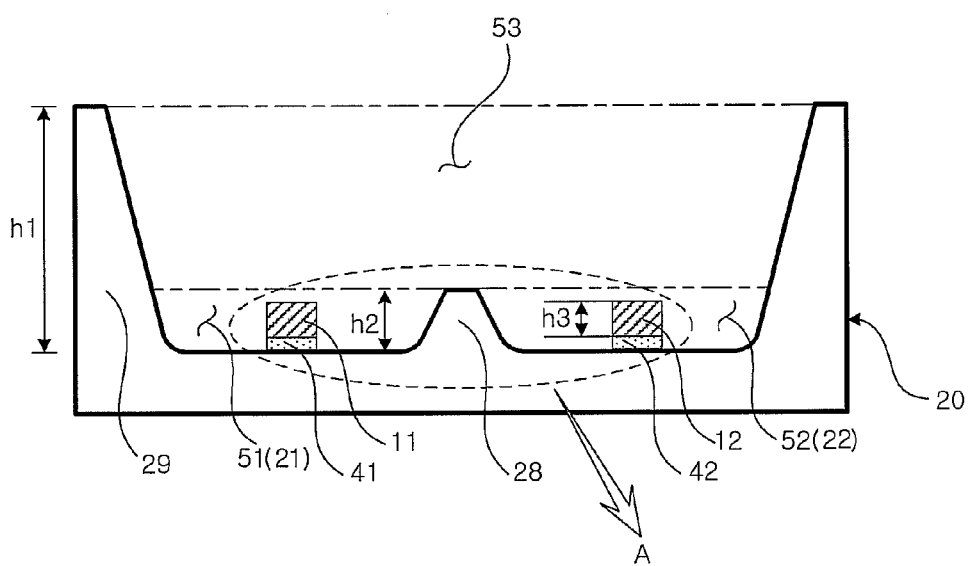
FIG. 2 is a cross section view illustrating the light emitting device package shown in FIG. 1 according to an embodiment.

FIG. 2 is a cross section view illustrating the light emitting device package shown in FIG. 1 according to an embodiment.

Referring to FIG. 2, the light emitting device package 100 includes the body 20 having the first and second cavities 22 and 23, a first heat conductive member 41 formed on a lower surface of the first cavity 22, the first light emitting device 11 positioned on the first heat conductive member 41, a second heat conductive member 42 formed on a lower surface of the second cavity 23, the second light emitting device 12 positioned on the second heat conductive member 42, first and second resin materials 51 and 52 filled in the first and second cavities 22 and 23, respectively, and a third resin material 53 filled in a region other than the first and second cavities 22 and 23.

The body 20 includes the main barrier wall 29 having a first height h1 and the auxiliary barrier wall 28 having a second height h2 that define the first and second cavities 22 and 23.

The second height h2 may be about 1.2 to about 2 times of a height h3 of one of the first and second light emitting devices 11 and 12. When the second height h2 is more than 2 times of the height h3, a mixed area of light emitted from the first and second light emitting devices 11 and 12 may be reduced when emitting white light, and as a result, a beam angle may be decreased. When the second height h2 is less than 1.2 times of the height h3, a mixed area of light emitted from the first and second light emitting devices 11 and 12 may be excessively increased when emitting white light, thus increasing probability of poor color mixing. This renders it difficult to implement white light.

Each of the main barrier wall 29 and the auxiliary barrier wall 28 may have an inclined surface by which a reflection angle of light emitted from the first and second light emitting devices 11 and 12 may be varied. By the inclined surface, a beam angle of light emitted may be adjusted.

As the beam angle decreases, light emitted from the first and second light emitting devices 11 and 12 to an outside is more concentrated, and on the contrary, as the beam angle increases, light emitted from the first and second light emitting devices 11 and 12 to an outside is less concentrated.

The first and second light emitting devices 111 and 112 may include, but not limited to, colored light emitting devices that emit red, green, blue, or white light, or UV (Ultra Violet) light emitting devices that emit UV rays.

The first and second light emitting devices 11 and 12 may have the same color or different colors.

As an example, for the light emitting device package 100 to emit white light, red, green, and blue light beams need to be mixed to one another. Two of the red, green, and blue light beams are emitted through the first and second resin materials 51 and 52, and the remaining colored light beam is emitted through the third resin material 53.

An example will now be described the first to third resin materials 51, 52, and 53 contain different phosphors that emits light of different colors.

The first and second resin materials 51 and 52 are filled in the first and second cavities 21 and 22 up to an upper surface of the auxiliary barrier wall 28.

The third resin material 53 is positioned on the first and second resin materials 51 and 52 and filled between the upper surface of the auxiliary barrier wall 28 and an upper surface of the main barrier wall 29.

The first and second light emitting devices 11 and 12 have the same chips, for example, blue chips. However, the embodiments of the present invention are not limited thereto. According to an embodiment, the first and second light emitting devices 11 and 12 may have chips of different colors.

For example, to emit white light, when the first and second light emitting devices 11 and 12 include blue chips, one of the first and second resin materials 51 and 52 may include a red phosphor, the other may include a green phosphor or a blue phosphor, and the third resin material 53 may include a yellow phosphor.

According to an embodiment, a transparent silicon film or a resin layer (not shown) may be provided on the third resin material 53.

According to an embodiment, the red phosphor may be, but not limited to, a nitride-based phosphor, the green or blue phosphor may be, but not limited to, a silicate-based or nitride-based phosphor, and the yellow phosphor may be, but not limited to, a YAG-based phosphor.

According to an embodiment, for the light emitting device package 100 to emit white light, one of the first and second resin materials 51 and 52 may include two types of phosphors that emit at least two or more colors of light, the other of the first and second resin materials 51 and 52 may include a phosphor that emits another color of light, and the third resin material 53 may not include any phosphor.

An example will now be described where one of the first resin materials 51 and 52 includes two types of phosphors and the other includes a phosphor.

The first and second resin materials 51 and 52 are filled in the first and second cavities 22 and 23 up to an upper portion of the auxiliary barrier wall 28.

The third resin material 53 is positioned on the first and second resin materials 51 and 52 and filled between the upper portion of the auxiliary barrier wall 28 and an upper portion of the main barrier wall 29.

The first and second light emitting devices 11 and 12 may have the same chips, for example, blue chips. According to an embodiment, the first and second light emitting devices 11 and 12 may have different colors of chips.

For example, when the first and second light emitting devices 11 and 12 have blue chips, one of the first and second resin materials 51 and 52 may include a red phosphor and the other may include a green and blue phosphor. And, the third resin material 53 may include a transparent silicon material without any phosphor.

The third resin material 53 may be formed of, but not limited to, a film or resin.

According to an embodiment, the red phosphor may be, but not limited to, a nitride-based phosphor, and the green or blue phosphor may be, but not limited to, a silicate-based and nitride-based phosphor. According to an embodiment, the red phosphor and the green and blue phosphor may be formed of the same type of phosphor.

The first and second heat conductive members 41 and 42, respectively, are formed on lower portions of the first and second cavities 22 and 23 under the first and second light emitting devices 11 and 12 independently from each other, and may have the same conductivity or different thermal conductivities from each other.

The first and second heat conductive materials have different thermal characteristics depending on heat generated from the first and second light emitting devices 11 and 12, and types and colors of the phosphors included in the first and second resin materials 51 and 52, and may easily dissipate heat generated from the first and second light emitting devices 11 and 12.

The first and second heat conductive members 41 and 42 may include, but not limited to, an adhesive or an adhering sheet.

For example, when the first and second light emitting devices 11 and 12 have the same blue chips, and a phosphor included in the first resin material 51 has low thermal characteristics than the phosphor included in a phosphor included in the second resin material 52, a thermal conductivity of the first heat conductive member 41 may be made to be larger than a thermal conductivity of the second heat conductive member 42 to prevent a lowering in brightness of the phosphor included in the first resin material 51.

Figure 3:
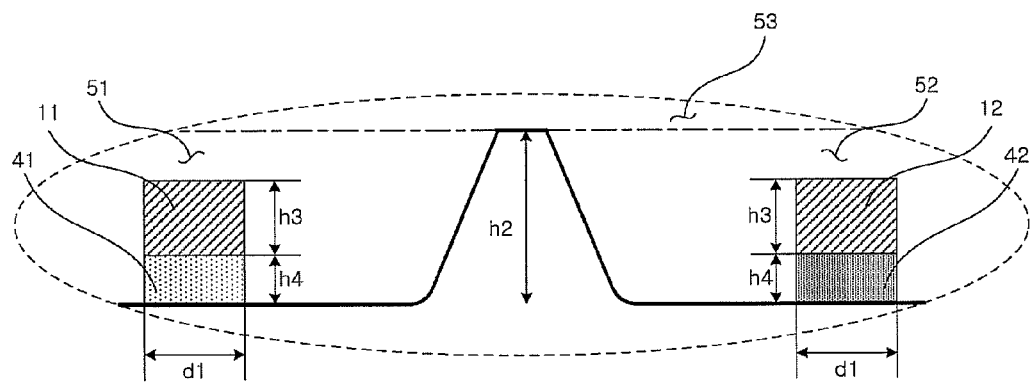
FIGS. 3 and 4 are expanded views illustrating area A of FIG. 2 according to embodiments.
Figure 4:
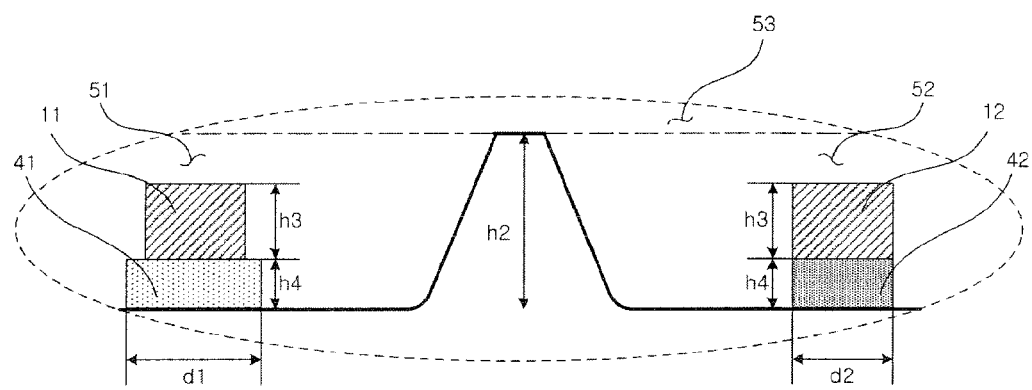

FIGS. 3 and 4 are expanded views illustrating area A of FIG. 2 according to embodiments.

Referring to FIG. 3, the first and second heat conductive members 41 and 42 have the same width d1 and the same height h4.

For example, the first and second heat conductive members 41 and 42 may be formed of different materials. A distance between an upper portion of the first light emitting device 11 and an upper portion of the first resin material 51 may be equal to a distance between an upper portion of the second light emitting device 12 and an upper portion of the second resin material 52.

The first and second heat conductive members 41 and 42 may have different thermal conductivities. Of the first and second heat conductive members 41 and 42, one having a higher conductivity may be positioned under one emitting more heat of the first and second light emitting devices 11 and 12. The generated heat may be dissipated through the body 20.

Referring to FIG. 4, the first and second heat conductive members 41 and 42 have the same height h4 and different widths, such as first width d1 and second width d2.

In a case where the first and second heat conductive members 41 and 42 are formed of different materials and the first light emitting device 11 radiates more heat than that of the second light emitting device 12, an increased width d1 of the first heat conductive member 41 increases an area of contacting the body 20, thus further prompting heat dissipation.

According to embodiments, the first and second heat conductive members 41 and 42 may have the same width and different heights, or may have different widths and different heights.

For example, at least one of width and height of the first and second heat conductive members 41 and 42 may be varied to achieve the maximum heat dissipation with the first and second light emitting devices 11 of limited widths and 12 and the first and second cavities 22 and 23 of limited widths.

Although it has been described in connection with FIGS. 2 to 4 that the first and second heat conductive members 41 and 42 have different thermal conductivities, the first and second heat conductive members 41 and 42 may also have the same thermal conductivity.

Figure 5:
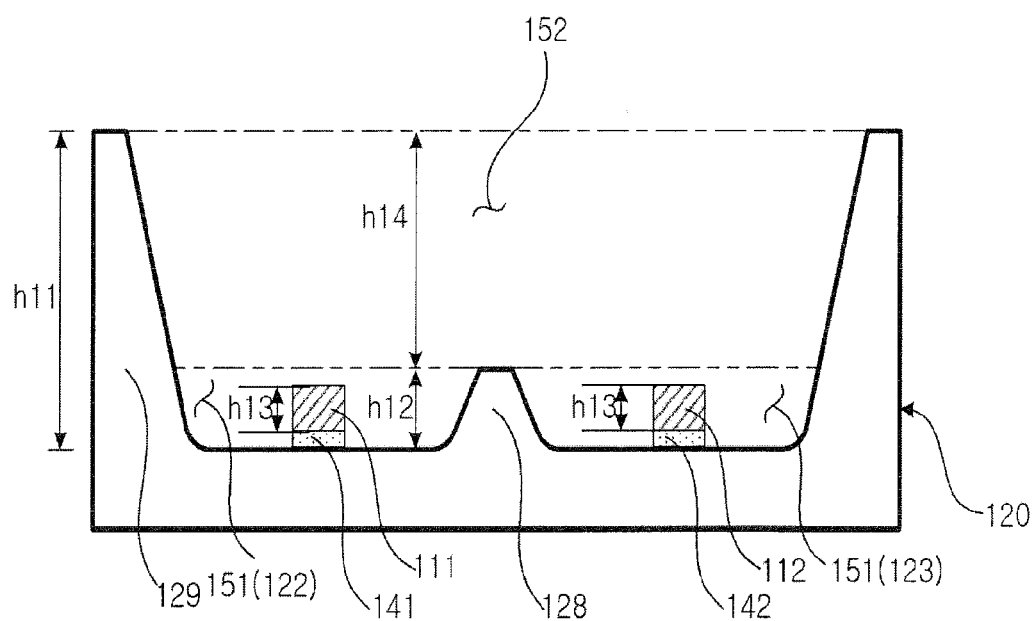
FIG. 5 is a cross section view illustrating the light emitting device package shown in FIG. 1 according to an embodiment.

FIG. 5 is a cross section view illustrating the light emitting device package shown in FIG. 1 according to an embodiment.

Referring to FIG. 5, the light emitting device package 100 includes a body 120 having first and second cavities 122 and 123, a first heat conductive member 141 formed on a lower surface of the first cavity 122, a first light emitting device 111 positioned on the heat conductive member 142, a second heat conductive member 142 formed on a lower surface of the second cavity 123, a second light emitting device 112 positioned on the second heat conductive member 142, first and second resin materials 151 respectively deposited on the first and second light emitting devices 111 and 112 to diffuse light emitted from the first and second light emitting devices 111 and 112, and a third resin material 152 deposited on the first and second resin materials 151 and excited by the light emitted from the first and second light emitting devices to emit light.

The body 120 includes a main barrier wall 129 having a first height h11 and an auxiliary barrier wall 128 having a second height h12 that define the first and second cavities 122 and 123.

The first height h11 is a height from lower surfaces of the first and second cavities 122 and 123 to an upper surface of the third resin material 152, and the second height h12 is a height from the lower surfaces of the first and second cavities 122 and 123 to upper surfaces of the first and the second cavities 151.

For example, the second height h12 of the auxiliary barrier wall 128 may be about 1.2 to about 2 times of a height h13 of one of the first and second light emitting devices 111 and 112. When the second height h12 is more than 2 times of the height h13, light emitted from the first and second light emitting devices 111 and 112 may cause a difference in brightness between an upper area of the auxiliary barrier wall 128 and the remaining area except for the upper area. When the second height h12 is less than 1.2 times of the height h13, light emitted from the first and second light emitting devices 111 and 113 may have a reduced difference in brightness between the upper area of the auxiliary barrier wall 128 and the remaining area, but light diffusion by the first and second resin materials 151 may be reduced, thus leading to an overall lowering in brightness characteristics.

Each of the main barrier wall 129 and the auxiliary barrier wall 128 may have an inclined surface. A beam angle of light emitted from the first and second light emitting devices 111 and 112 may be adjusted according to the degree of inclination of the inclined surface.

As the beam angle decreases, light emitted from the first and second light emitting devices 111 and 112 to an outside is more concentrated, and on the contrary, as the beam angle increases, light emitted from the first and second light emitting devices 111 and 112 to an outside is less concentrated.

The first and second light emitting devices 111 and 112 may include, but not limited to, colored light emitting devices that emit red, green, blue, or white light, or UV (Ultra Violet) light emitting devices that emit UV rays.

The first and second light emitting devices 111 and 112 may have the same color or different colors.

The first and second heat conductive members 141 and 142 may have the same conductivity or different thermal conductivities from each other, and may be formed independently from each other.

The first and second heat conductive materials 141 and 142 have different thermal characteristics depending on heat generated from the first and second light emitting devices 111 and 112 and type and color of a phosphor included in the third resin material 152. The first to third resin materials 151 and 152 may have different densities and the first and second may have different thermal characteristics. The first and second heat conductive members 141 and 142 may easily dissipate heat generated from the first and second light emitting devices 111 and 112.

The first and second heat conductive members 141 and 142 may include, but not limited to, an adhesive or an adhering sheet.

According to embodiments, the first and second heat may have different thicknesses or different heights, or may have the same width and the same height.

The first and second heat conductive members 141 and 142 may have different thermal conductivities for heat generated from the first and second light emitting devices 111 and 112 depending on the density of the first and second resin materials 151 and the color of the third resin material 152. Of the first and second heat conductive members 141 and 142, one having a higher conductivity may be positioned under one emitting more heat of the first and second light emitting devices 111 and 112. The heat generated from the first and second light emitting devices 111 and 112 may be dissipated through the body 20. Accordingly, it may be possible to minimize loss of brightness of light emitted through the third resin material 152.

The first and second resin materials may include a light diffusing material that includes any one or a mixture of at least two or more of white metal oxides including $TiO_2$, $BaO$, $SiO_2$, $MgO$, and $Y_2O_3$.

The first and second resin materials 151 are deposited on the first and second light emitting devices 111 and 112, respectively, and have a height the same as the second height h12 of the auxiliary barrier wall 128. The third resin material 152 has a height h14 that is a difference between the first height h11 and the second height h12, and is deposited on the first resin materials 151.

The first and second resin materials 151 have the same deposition structure.

According to embodiments, the third resin material 152 may include a phosphor or two or more types of phosphors that depend on the color of light emitted from the first and second light emitting devices 111 and 112.

For example, the third resin material 152 may include, but not limited to, one of a red phosphor, a green phosphor, and a blue phosphor. Other colors of phosphors may also be employed according to an embodiment.

According to an embodiment, the first and second light emitting devices 111 and 112 may be vertical types of light emitting devices that direct 70% or more of an overall amount of light emitted to an upper side.

According to embodiments, the first and second light emitting devices 111 and 112 may include horizontal types or flip types. The first and second resin materials 151 may be deposited on the entire surfaces of the first and second light emitting devices 111 and 112.

In the light emitting device package according to the embodiments described in connection with FIG. 5, the first and second resin materials including the light diffusing material are deposited on the light emitting devices, and the third resin material including a phosphor is deposited on the first and second resin materials, wherein the phosphor is excited by light diffused by the first and second resin materials to emit light. Accordingly, brightness loss occurring while implementing a single color of light may be further reduced compared to when the first and second resin materials are not used. Since heat generated from the light emitting devices is dissipated to the outside of the body by the heat conductive members having different conductivities, a lowering in brightness of the phosphor may be prevented.

Figure 6:
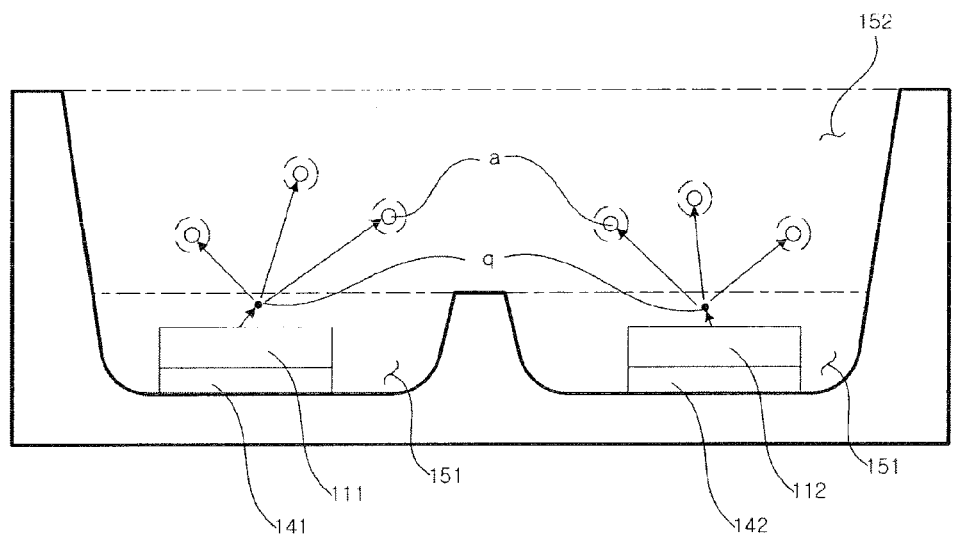
FIG. 6 is a cross section view illustrating an operation of the light emitting device package shown in FIG. 5.

FIG. 6 is a cross section view illustrating an operation of the light emitting device package shown in FIG. 5.

The same parts as those described in connection with FIG. 5 will be briefly described or not described.

Referring to FIG. 6, the light emitting device package 100 includes the first and second light emitting devices 111 and 112, the first and second heat conductive members 141 and 142, and the first to third resin materials 151 and 152.

The first and second light emitting devices 111 and 112 emit light using electricity supplied from an external source (not shown).

Since the first and second resin materials 151 include the light diffusing material q, the first and second resin materials 151 diffuse or scatter light emitted from the first and second light emitting devices 111 and 112 toward the third resin material 152 and the first and second heat conductive members 141 and 142, i.e., in the overall directions.

The third resin material 152 includes a phosphor a having a single color, which is excited by light diffused or scattered by the light diffusing material q to emit light.

For example, the phosphor a included in the third resin material 152 is excited to generate light having a single color.

Although it has been described that the first to third resin materials 151 and 152 have a flat central portion, the embodiments of the present invention are not limited thereto. For example, the first to third resin materials 151 and 152 may also have a concave central portion.

In the case of having a concave central portion, the first to third resin materials 151 and 152 may serve as lenses so that an illumination angle of light emitted from the first and second light emitting devices 111 and 112 may be reduced to increase concentration of the light.

According to an embodiment, the third resin material 152 may include at least two or more types of phosphors (not shown) that have difference colors. For example, when the light emitting device package 100 generates white light or light of other colors than red, green, and blue, at least two types of phosphors having red, green, blue, and yellow may be mixed to one another.

Figure 7:
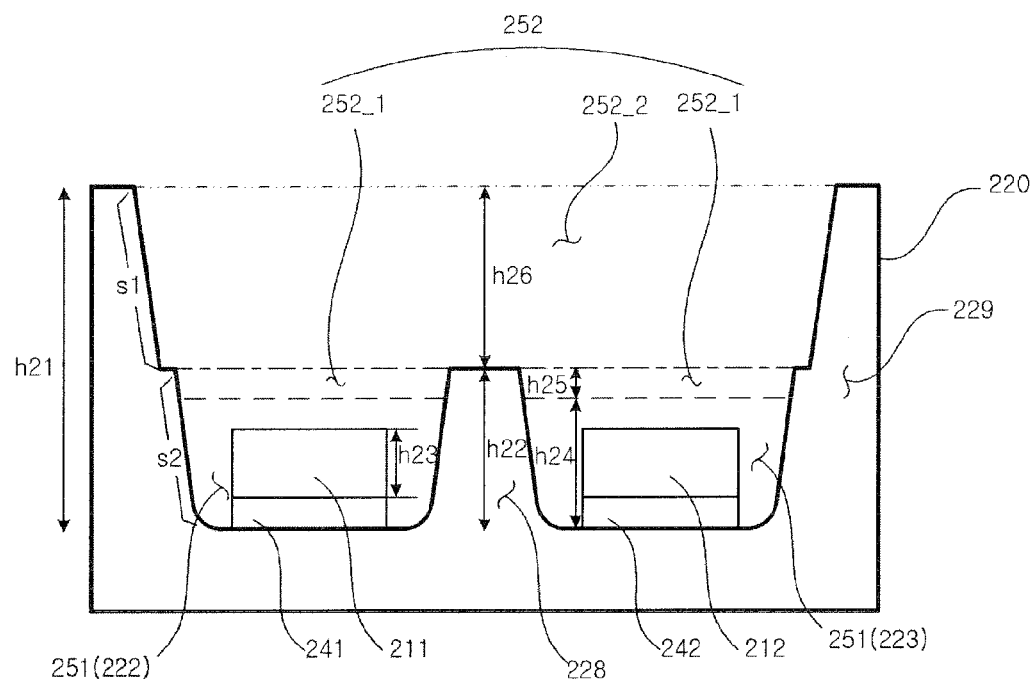
FIG. 7 is a cross section view illustrating the light emitting device package shown in FIG. 1 according to an embodiment.

FIG. 7 is a cross section view illustrating the light emitting device package shown in FIG. 1 according to an embodiment.

Referring to FIG. 7, the light emitting device package 100 includes a body 220 having first and second cavities 222 and 223, a first heat conductive member 241 formed on a lower surface of the first cavity 222, a first light emitting device 211 formed on the first heat conductive member 241, a second heat conductive member 242 formed on a lower surface of the second cavity 223, a second light emitting device 212 formed on the second heat conductive member 242, first and second resin materials 251 deposited on the first and second light emitting devices 211 and 212, respectively, and a third resin material 252 deposited on the first and second resin materials 251.

The body 220 includes a main barrier wall 229 having a first height h21 and an auxiliary barrier wall 228 having a second height h22 lower than the first height h21. The main barrier wall 229 and the auxiliary barrier wall 228 define the first and second cavities 222 and 223.

The first height h21 is a distance between lower surfaces of the first and second cavities 222 and 223 and an upper surface of the third resin material 252, and the second height h22 is a distance between the lower surfaces of the first and second cavities 222 and 223 and a lower surface of the third resin material 252.

According to an embodiment, the second height h22 of the auxiliary barrier wall 228 may be about 1.2 to about 2 times of the height h23 of one of the first and second light emitting devices 211 and 212. When the second height h22 is more than 2 times of the height h23, light emitted from the first and second light emitting devices 211 and 212 may cause a difference in brightness between an upper area of the auxiliary barrier wall 228 and the remaining area except for the upper area. When the second height h22 is less than 1.2 times of the height h23, light emitted from the first and second light emitting devices 211 and 212 may have a reduced difference in brightness between the upper area of the auxiliary barrier wall 228 and the remaining area, but light diffusion by the first and second resin materials 251 may be reduced, thus leading to an overall lowering in brightness characteristics.

Each of the main barrier wall 229 and the auxiliary barrier wall 228 may have an inclined surface. A beam angle of light emitted from the first and second light emitting devices 211 and 212 may be adjusted according to the degree of inclination of the inclined surface.

As the beam angle decreases, light emitted from the first and second light emitting devices 211 and 212 to an outside is more concentrated, and on the contrary, as the beam angle increases, light emitted from the first and second light emitting devices 211 and 212 to an outside is less concentrated.

The main barrier wall 229 includes a step portion that defines first and second inclined surfaces s1 and s2. A height of the second inclined surface s2 may be identical to the second height h22 of the auxiliary barrier wall 228. However, the embodiment of the present invention is not limited thereto.

The first and second inclined surfaces s1 and s2 may include different slopes. At least one of the first and second inclined surfaces s1 and s2 may have the same slope as a slope of an inclined surface of the auxiliary barrier wall 228. However, the embodiment of the present invention is not limited thereto.

The first and second light emitting devices 211 and 212 may include, but not limited to, colored light emitting devices that emit red, green, blue, or white light, or UV (Ultra Violet) light emitting devices that emit UV rays.

The first and second light emitting devices 211 and 212 may have the same color or different colors.

The first and second heat conductive members 241 and 242 may have different thermal conductivities from each other, and may be formed independently from each other.

The first and second heat conductive members 241 and 242 may include, but not limited to, an adhesive or an adhering sheet that has different thermal conductivities.

For example, the first and second heat conductive members 241 and 242 may have the same width and the same height. This may be true for when the first and second light emitting devices 211 and 212 emit the same color of light or different colors of light.

Depending on density of the first and second resin materials 251 and color of the third resin material 252, conductance of heat generated from the first light emitting device 211 may be different from conductance of heat generated from the second light emitting device 212. Of the first and second heat conductive members 241 and 242, one having a higher conductivity may be positioned under one emitting more heat of the first and second light emitting devices 211 and 212. The heat generated from the first and second light emitting devices 211 and 212 may be dissipated through the body 20. Accordingly, it may be possible to minimize loss of brightness of light emitted through the third resin material 252.

The first and second resin materials 251 may include a light diffusing material that includes any one or a mixture of at least two or more of white metal oxides including $TiO_2$, $BaO$, $SiO_2$, $MgO$, and $Y_2O_3$.

The first and second resin materials 251 are deposited on the first and second light emitting devices 211 and 212, respectively, and have a fourth height h24 less than the second height h22 of the auxiliary barrier wall 228. The third resin material 252 includes first resin layers 252_1 and a second resin layer 252_2. The first resin layers 252_1 has a fifth height h25 and are deposited on the first and second resin materials 251, and the second resin layer 252_2 has a sixth height h26 and is deposited on the first resin layers 252_1.

The first and second resin layers 252_1 and 252_2 may have phosphor having different colors.

For example, each of the first and second resin layers 252_1 and 252_2 may have any one of, but not limited to, red, green, and blue phosphors.

The second resin layer 252_2 may include a phosphor that may be excited by light radiated from a phosphor included in the first resin layers 252_1 to emit light. For example, when the first resin layers 252_1 include a green or blue phosphor, the second resin layer 252_2 may include a red phosphor, so that the red phosphor is excited by light radiated from the green or blue phosphor to emit light.

According to an embodiment, the first and second light emitting devices 211 and 212 may be, but not limited to, vertical types of light emitting devices that direct 70% or more of an overall amount of light emitted to an upper side. According to embodiments, the first and second light emitting devices 211 and 212 may include horizontal types or flip types.

Figure 8:
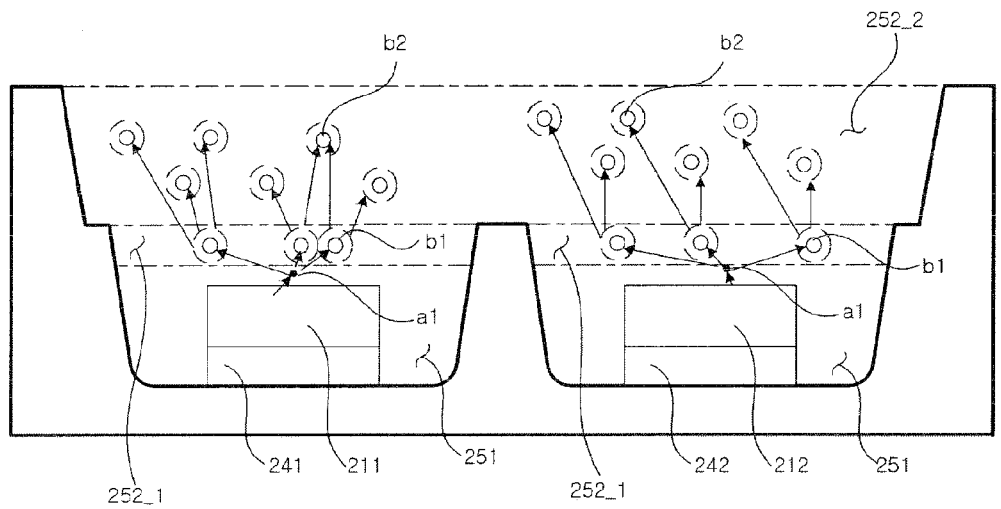
FIG. 8 is a cross section view illustrating an operation of the light emitting device package shown in FIG. 7.

FIG. 8 is a cross section view illustrating an operation of the light emitting device package shown in FIG. 7.

The same parts as those described in connection with FIG. 7 will be briefly described or not described.

Referring to FIG. 8, the light emitting device package 100 includes the first and second light emitting devices 211 and 212, the first and second heat conductive members 241 and 242, and the first to third resin materials 251 and 252.

The first and second light emitting devices 211 and 212 emit light using electricity supplied from an external source (not shown).

Since the first and second resin materials 251 include a light diffusing material a1, the first and second resin materials 251 diffuse or scatter light emitted from the first and second light emitting devices 211 and 212 toward the third resin material 252 and the first and second heat conductive members 241 and 242, i.e., in the overall directions.

The third resin material 252 includes the first resin layers 252_1 and the second resin layer 252_2. The first resin layers 252_1 includes a first phosphor b1 that is excited by light diffused or scattered by the light diffusing material a1 to emit light. The second resin layer 252_2 includes a second phosphor b2 that is excited by light radiated from the first phosphor b1 to emit light.

For example, the first and second phosphors b1 and b2 may have different colors, and each of the first and second phosphors b1 and b2 may have a single type of phosphor.

Although it has been described that the first to third resin materials 251 and 252 have a flat central portion, the embodiments of the present invention are not limited thereto. For example, the first to third resin materials 251 and 252 may also have a concave central portion.

In the case of having a concave central portion, the first to third resin materials 251 and 252 may serve as lenses so that an illumination angle of light emitted from the first and second light emitting devices 211 and 212 may be reduced to increase concentration of the light.

Although it has been described that the first and second heat conductive members 241 and 242 have the same width and the same thickness, the embodiments of the present invention are not limited thereto. According to embodiments, the first and second heat conductive members 241 and 242 may have different widths or different thicknesses.

Figure 9:
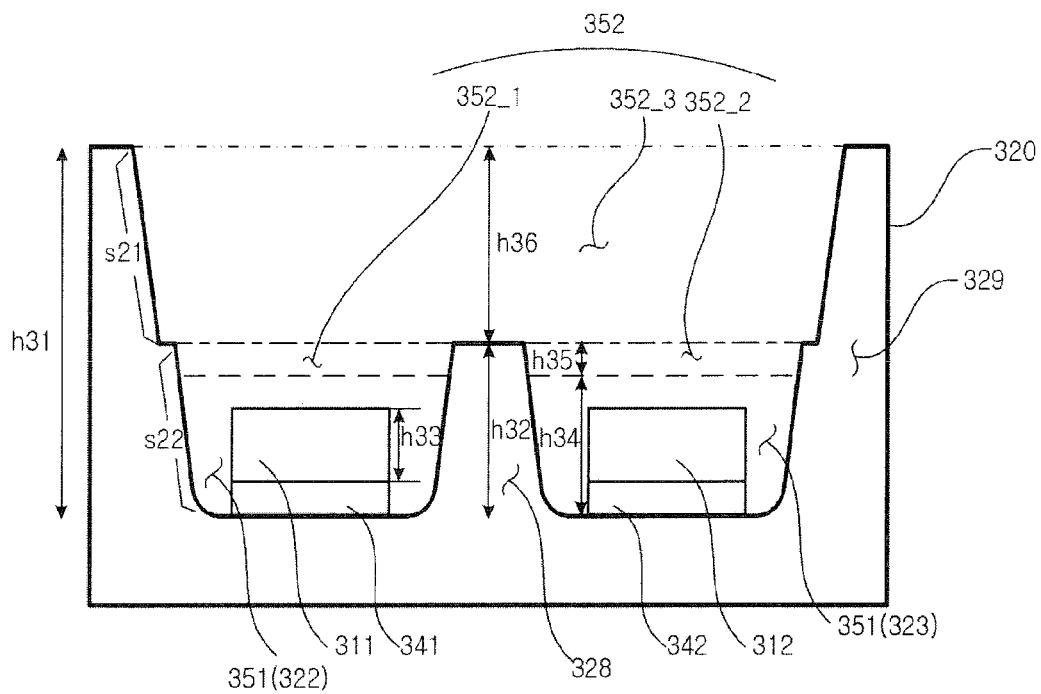
FIG. 9 is a cross section view illustrating the light emitting device package shown in FIG. 1 according to an embodiment.

FIG. 9 is a cross section view illustrating the light emitting device package shown in FIG. 1 according to an embodiment.

Referring to FIG. 9, the light emitting device package 100 includes a body 320 having first and second cavities 322 and 323, a first heat conductive member 341 formed on a lower surface of the first cavity 322, a first light emitting device 311 formed on the first heat conductive member 341, a second heat conductive member 342 formed on a lower surface of the second cavity 323, a second light emitting device 312 formed on the second heat conductive member 342, first and second resin materials 351 deposited on the first and second light emitting devices 311 and 312, respectively, and a third resin material 352 deposited on the first and second resin materials 351.

The body 320 includes a main barrier wall 329 having a first height h31 and an auxiliary barrier wall 328 having a second height h32 lower than the first height h31. The main barrier wall 329 and the auxiliary barrier wall 328 define the first and second cavities 322 and 323.

The first height h31 is a distance between lower surfaces of the first and second cavities 322 and 323 and an upper surface of the third resin material 352, and the second height h32 is a distance between the lower surfaces of the first and second cavities 322 and 323 and a lower surface of the third resin material 352.

According to an embodiment, the second height h32 of the auxiliary barrier wall 328 may be about 1.2 to about 2 times of a height h33 of one of the first and second light emitting devices 311 and 312.

The main barrier wall 329 includes a step portion that defines first and second inclined surfaces s21 and s22. A height of the second inclined surface s22 is identical to the second height h32 of the auxiliary barrier wall 328.

The first and second light emitting devices 311 and 312 may include, but not limited to, colored light emitting devices that emit red, green, blue, or white light, or UV (Ultra Violet) light emitting devices that emit UV rays.

The first and second heat conductive members 341 and 342 may have different thermal conductivities from each other, and may be formed independently from each other. The first and second heat conductive members 341 and 342 may include, but not limited to, an adhesive or an adhering sheet that has the same thermal conductivity.

The first and second resin materials 351 may include a light diffusing material that includes any one or a mixture of at least two or more of white metal oxides including $TiO_2$, $BaO$, $SiO_2$, $MgO$, and $Y_2O_3$.

The first and second resin materials 351 are deposited on the first and second light emitting devices 311 and 312, respectively, and have a fourth height h34 less than the second height h32 of the auxiliary barrier wall 328. The third resin material 352 includes a first resin layer 352_1, a second resin layer 352_2, and a third resin layer 352_3. The first resin layer 352_1 has a fifth height h35 and is deposited on the first resin material 351 in the first cavity 322, the second resin layer 352_2 has the fifth height h35 and is deposited on the second resin material 351 in the second cavity 323, and the third resin layer 352_3 has a sixth height h36 and is deposited on the first and second resin layers 352_1 and 352_2.

According to an embodiment, each of the first and second resin layers 352_1 and 352_2 may include a single type of phosphor, and a phosphor included in the first resin layer 352_1 may have a different color from that of a phosphor included in the second resin layer 352_2. For example, each of the first and second resin layers 352_1 and 352_2 may include, but not limited to, one of a green phosphor and a blue phosphor.

The third resin layer 352_3 may include a phosphor that may be excited by light radiated from phosphors included in the first and second resin layers 352_1 and 352_2 to emit light. For example, the third resin layer 352_3 may include a red phosphor.

For the light emitting device package 100 to be able to generate white light, red, green, and blue light need to be mixed with one another. For example, when the first and second resin layers 352_1 and 352_2 emit two of red, green, and blue light, the third resin layer 352_3 needs to emit the remaining color of light.

An example will now be described where the first and second resin layers 352_1 and 352_2 respectively have a single type of phosphor and a phosphor included in the first resin layer 352_1 and a phosphor included in the second resin layer 352_2 emit different colors of light.

For example, to emit white light, when the first and second light emitting devices 311 and 312 include blue chips, one of the first and second resin layers 352_1 and 352_2 includes a green phosphor and the other includes a blue phosphor, and the third resin layer 352_3 includes a red phosphor.

According to an embodiment, a transparent silicon film or resin layer (not shown) may be further provided on the third resin layer 352_3.

According to an embodiment, the red phosphor may be, not limited to, a nitride-based phosphor, and the green or blue phosphor may be, not limited to, a silicate-based or nitride-based phosphor.

Figure 10:
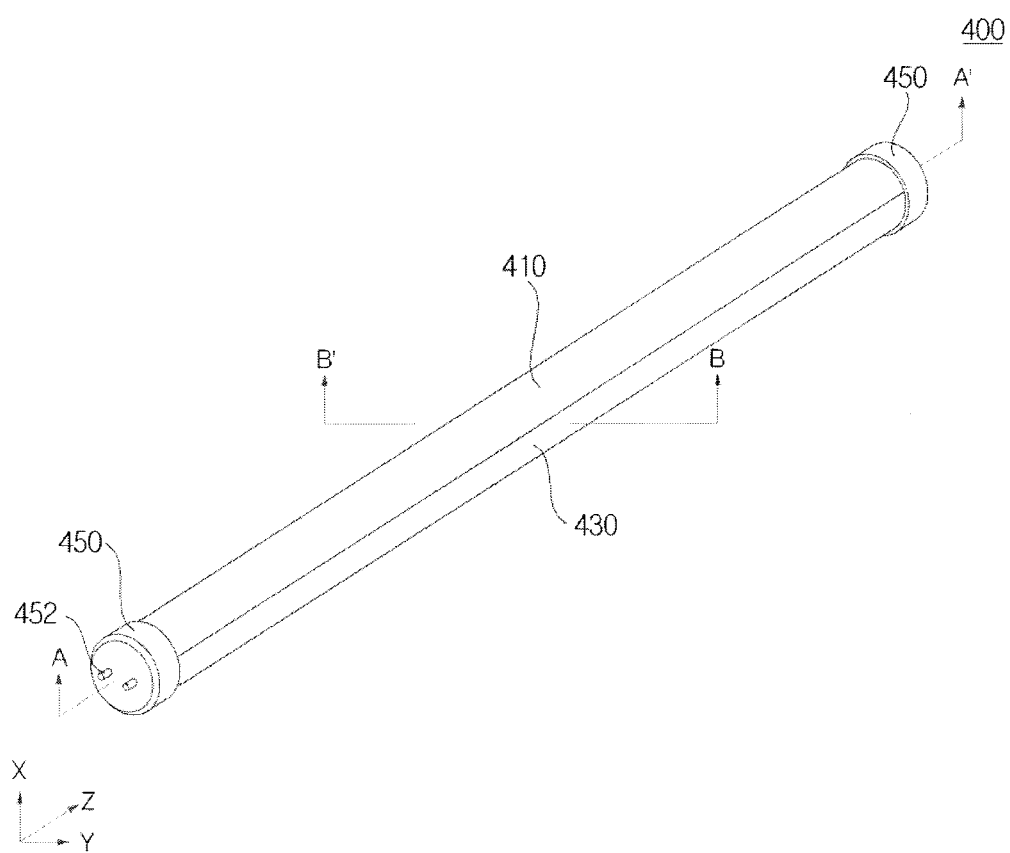
FIG. 10 is a perspective view illustrating an illumination device having a light emitting devices package according to an embodiment.
Figure 11:
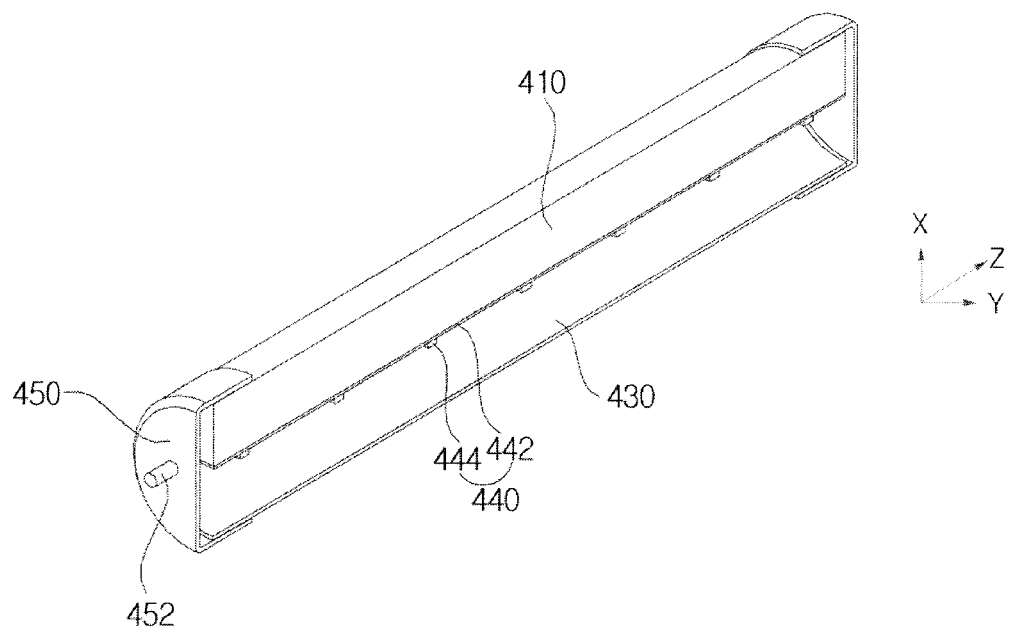
FIG. 11 is a cross section view taken along line A-A' of FIG. 10.

FIG. 10 is a perspective view illustrating an illumination device having a light emitting device package according to an embodiment. FIG. 11 is a cross section view taken along line A-A' of FIG. 10.

In FIG. 10, Z direction refers to a lengthwise direction of the illumination device 400, Y direction refers to a horizontal direction perpendicular to the lengthwise direction Z, and X direction refers to a height direction perpendicular to the lengthwise direction Z and the horizontal direction Y.

FIG. 11 illustrates a cross section obtained by cutting the illumination device 400 with respect to a plane defined by the lengthwise direction Z and the height direction X.

Referring to FIGS. 10 and 11, the illumination device 400 includes a body 410, a cover 430 coupled to the body 410, and sealing caps 450 positioned at both ends of the body 410.

A light emitting device module 440 is positioned at a lower surface of the body 410. The body 410 is formed of a metal having good thermal conductivity and heat diffusing effects so that heat generated from a light emitting device package 444 may be dissipated through an upper surface of the body 410 to the outside.

A plurality of light emitting device packages 444 having various colors may be arranged in various rows on a printed circuit board 442. According to embodiments, the light emitting device packages 444 may be spaced apart from one another by the same or different distances to adjust brightness of light. The printed circuit board 442 may be made of metal to effectively dissipate heat.

The cover 430 may be formed to have a rounded shape that surrounds a lower surface of the body 410.

The cover 430 protects the light emitting device module 440 from outside unwanted materials. The cover 430 may include light diffusing particles that prevent a user from being dazzled by light emitted from the light emitting device packages 444 as will be described below and that enable light to be evenly directed to the outside. According to an embodiment, a prism pattern may be formed on at least one of an inner surface and an outer surface of the cover 430. According to an embodiment, a phosphor may be applied on at least one of an inner surface and an outer surface of the cover 430.

Light generated from the light emitting device packages 444 is exited to the outside through the cover 430. Accordingly, the cover 430 has good light transmittance and thermal resistance sufficient to endure heat generated from the light emitting device packages 444. According to embodiments, the cover 430 may include polyethylenterephthalate (PET), polycarbonate (PC), or polymethylmethacrylate (PMMA).

The sealing caps 450 are positioned at both ends of the body 410 and seal a power supply (not shown). The sealing caps 450 include pins 452 similar to pins included in an existing fluorescent lamp so that the illumination device 400 may be used instead of the fluorescent lamp without additional devices.

Figure 12:
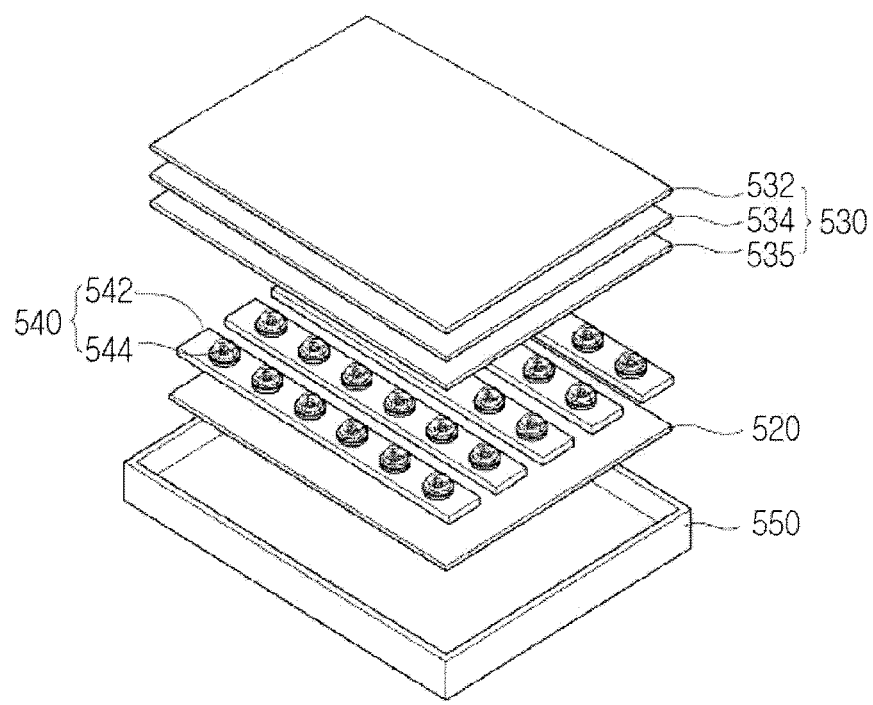
FIG. 12 is a perspective view illustrating a backlight device including a light emitting device package according to an embodiment.

FIG. 12 is a perspective view illustrating a backlight device including a light emitting device package according to an embodiment.

FIG. 12 illustrates a vertical-type backlight device. Referring to FIG. 12, the backlight device includes a lower receiving member 550, a reflecting plate 520, a plurality of light emitting device modules 540, and a plurality of optical sheets 530.

Each of the light emitting device modules 540 includes a printed circuit board 542 and a plurality of light emitting device packages 544 that are arranged on the printed circuit board 542 to form an array.

A plurality of protrusions may be formed on a lower surface of the light emitting device package 544 and may improve mixing of red, green, and blue light.

The reflecting plate 520 includes a plate having high reflectivity and may reduce light loss. The optical sheets 530 may include at least one of a brightness enhancing sheet 532, a prism sheet 534, and a diffusing sheet 535.

The diffusing sheet 536 directs light emitted from the light emitting device packages 544 toward a liquid crystal display panel (not shown) and diffuses the light to have a uniform distribution over a broad area. The prism sheet 534 allows light inclinedly coming to be perpendicularly exited. For example, at least one prism sheet 534 may be arranged under the liquid crystal display panel (not shown) to direct light coming from the diffusing sheet 535 in an orthogonal direction. The brightness enhancing sheet 532 transmits light beams that travel in a direction parallel to its transmittance axis and reflects light beams that travel in a direction perpendicular to the transmittance axis.

Figure 13:
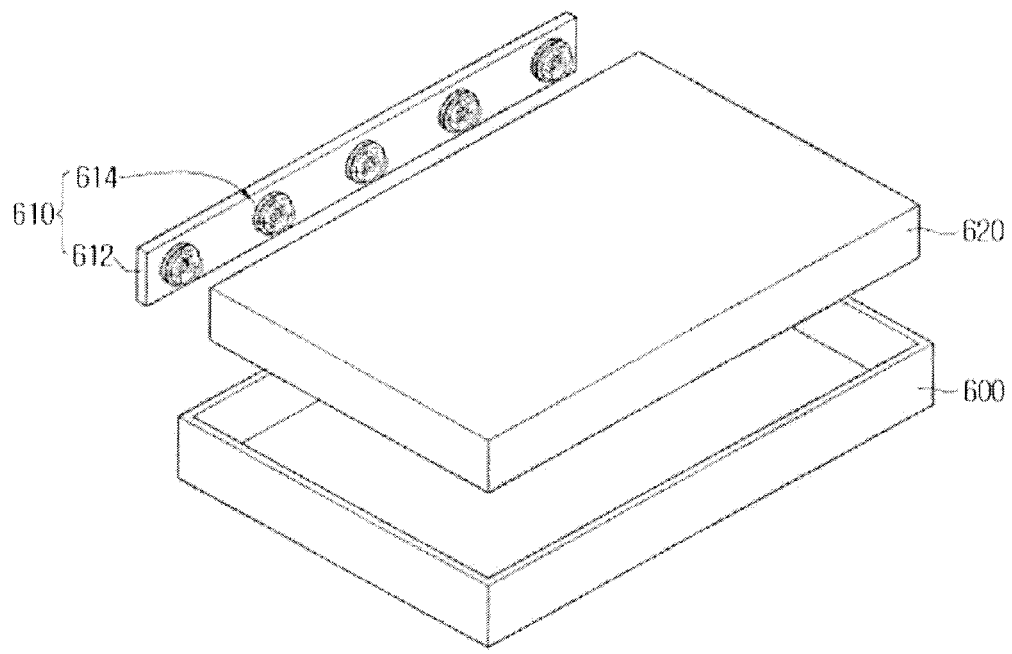
FIG. 13 is a perspective view illustrating a backlight device including a light emitting device package according to an embodiment.

FIG. 13 is a perspective view illustrating a backlight device including a light emitting device package according to an embodiment.

FIG. 13 illustrates an edge-type backlight device. Referring to FIG. 13, the backlight device includes a lower receiving member 600, a light emitting device module 610 that emits light, a light guide plate 620 that is arranged adjacent to the light emitting device module 610, and a plurality of optical sheets (not shown). The plurality of optical sheets (not shown) may be located over the light guide plate 620, and may be the same as the plurality of optical sheets 530 shown in FIG. 12.

The light emitting device module 610 includes a printed circuit board 612 and a plurality of light emitting device packages 614 that are arranged on the printed circuit board 612 to form an array. The printed circuit board 612 may include a metal core printed circuit board (MCPCB) or a printed circuit board formed of FR4. The printed circuit board 612 may be shaped as a rectangular plate, and according to embodiments, may have various shapes depending on the structure of the backlight device.

The light guide plate 620 guides light emitted from the light emitting device packages 614 toward a liquid crystal display panel (not shown). The plurality of optical sheets (not shown) may be positioned on a rear surface of the light guide plate 620 to provide a uniform brightness distribution and enhanced vertical incidence for light coming from the light guide plate 620. Also, a reflection sheet (not shown) may be located on a rear surface of the light guide plate 620 to reflect light toward the light guide plate 620.

According to an embodiment, the vertical-type backlight device shown in FIG. 12 may be used in conjunction with the edge-type backlight device shown in FIG. 13.

The illumination device 400 and the backlight devices 500 and 600 may be included in a lighting system. Further, any devices for illumination, including the light emitting device packages, may be included in the lighting system.

It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiment's usefulness is not limited thereto and that the invention can be beneficially utilized in any number of environments and implementations. The foregoing description and drawings are, accordingly, to be regarded in an illustrative rather than a restrictive sense.

What is claimed is:

1. A light emitting device package comprising:
   first and second light emitting devices;
   a body having a first cavity in which the first light emitting device is provided and a second cavity in which the second light emitting device is provided;
   a resin material formed in the cavity;
   a first heat conductive member only under the first light emitting device and on a lower surface of the first cavity, and the first heat conductive member provided in the first cavity; and
   a second heat conductive member only under the second light emitting device and on a lower surface of the second cavity, and the second heat conductive member provided in the second cavity, wherein the resin material includes:
   a first resin material formed in the first cavity,
   a second resin material formed in the second cavity, and
   a third resin material formed an upper surface of the first and second resin materials,
   wherein at least one of the first resin material and the second resin material includes a light diffusing material that includes a white metal oxide,
   wherein a thermal conductivity of the first heat conductive member provided between the first light emitting device and the lower surface of the first cavity is different from a thermal conductivity of the second heat conductive member provided between the second light emitting device and the lower surface of the second cavity,
   wherein the first light emitting device to emit more heat than the second light emitting device,
   wherein the first heat conductive member has a higher conductivity than the second heat conductive member, and
   wherein a width of the first heat conductive member on the lower surface of the first cavity is greater than a width of the second heat conductive member on the lower surface of the second cavity, and the width of the first heat conductive member is greater than a width of the first light emitting device.

2. The light emitting device package of claim 1, wherein the body includes a main barrier wall and an auxiliary barrier wall that define the first and second cavities, wherein the auxiliary barrier wall is lower than the main barrier wall.

3. The light emitting device package of claim 2, wherein a height of the auxiliary barrier wall is about 1.2 times to about 2 times higher than a height of the at least one of the first and second light emitting devices.

4. The light emitting device package of claim 2, wherein a height of the first and second resin materials is same as or lower than a height of the auxiliary barrier wall.

5. The light emitting device package of claim 2, wherein the main barrier wall includes a step portion that defines first and second inclined surfaces.

6. The light emitting device package of claim 5, wherein a height of the second inclined surface is same as a height of the auxiliary barrier wall.

7. The light emitting device package of claim 1, wherein
   a height of the first resin material is about 1.2 times to about 2 times higher than a height of at least one of the first and second light emitting devices.

8. The light emitting device package of claim 1, wherein at least one selected from the group consisting of the first to third resin material includes a phosphor.

9. The light emitting device package of claim 1, wherein the first to third resin material includes a phosphor that is different colors.

10. The light emitting device package of claim 1, wherein at least one selected from the group consisting of the first to third resin material includes a concave central portion.

11. The light emitting device package of claim 1, wherein the light diffusing material that includes a white metal oxide includes at least one selected from the group consisting of $TiO_2$, $BaO$, $SiO_2$, $MgO$, and $Y_2O_3$.

12. The light emitting device package of claim 1, wherein the light diffusing material that includes a white metal oxide includes at least one of $TiO_2$, $BaO$, $SiO_2$, $MgO$, and $Y_2O_3$.

13. The light emitting device package of claim 2, wherein a height of the first and second resin materials is same as or lower than a height of the auxiliary barrier wall.

14. A light emitting device package comprising:
    first and second light emitting devices;
    a body having a first cavity in which the first light emitting device is provided and a second cavity in which the second light emitting device is provided;
    a first heat conductive member only under the first light emitting device and on a lower surface of the first cavity, and the first heat conductive member is in the first cavity;
    a second heat conductive member only under the second light emitting device and on a lower surface of the second cavity, and the second heat conductive member is in the second cavity; and
    a resin material formed in the cavity, wherein the resin material includes:
    a first resin material formed in the first cavity,
    a second resin material formed in the second cavity, and
    a third resin material formed an upper surface of the first and second resin materials,
    wherein at least one of the first resin material and the second resin material includes a light diffusing material that includes a white metal oxide,
    wherein a width of the first heat conductive member between the first light emitting device and the lower surface of the first cavity is different than a width of the second heat conductive member between the second light emitting device and the lower surface of the second cavity,
    wherein the first light emitting device to emit more heat than the second light emitting device,
    wherein the first heat conductive member has a higher conductivity than the second heat conductive member, and
    wherein a width of the first heat conductive member on the lower surface of the first cavity is greater than a width of the second heat conductive member on the lower surface of the second cavity, and the width of the first heat conductive member is greater than a width of the first light emitting device.

15. The light emitting device package of claim 14, wherein the body includes a main barrier wall and an auxiliary barrier wall that define the first and second cavities, wherein the auxiliary barrier wall is lower than the main barrier wall.

16. The light emitting device package of claim 1, wherein the first heat conductive member is in contact with the first light emitting device, and
the second heat conductive member is in contact with the second light emitting device.

17. The light emitting device package of claim 15, wherein a height of the auxiliary barrier wall is about 1.2 times to about 2 times higher than a height of the first light emitting device.

* * * * *